United States Patent [19]
Ito

[11] Patent Number: 6,104,083
[45] Date of Patent: *Aug. 15, 2000

[54] LEAD FRAME USED FOR SEMICONDUCTOR CHIPS OF DIFFERENT BIT CONFIGURATIONS

[75] Inventor: Seigo Ito, Yokohama, Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/936,419

[22] Filed: Sep. 24, 1997

[30] Foreign Application Priority Data

Oct. 4, 1996 [JP] Japan ..................................... 8-264166

[51] Int. Cl.[7] .......................... H01L 23/495; H01L 21/50
[52] U.S. Cl. ........................................... 257/666; 438/123
[58] Field of Search ................................... 257/666, 676; 438/106, 123

[56] References Cited

U.S. PATENT DOCUMENTS

| | | | |
|---|---|---|---|
| 5,233,220 | 8/1993 | Lamson et al. | 257/666 |
| 5,252,854 | 10/1993 | Arita et al. | 257/676 |
| 5,468,991 | 11/1995 | Lee et al. | 257/666 |
| 5,812,381 | 9/1998 | Shigeta et al. | 361/813 |

*Primary Examiner*—Olik Chaudhuri
*Assistant Examiner*—Howard Weiss
*Attorney, Agent, or Firm*—Finnegan, Henderson, Farabow, Garrett & Dunner, L.L.P.

[57] ABSTRACT

The lead frame comprises a plurality of inner leads adhered onto a semiconductor chip by means of adhesive tape provided on the semiconductor chip, and a plurality of outer leads each formed integrally with corresponding one of the inner leads. The plurality of inner leads include an inner lead group having a plurality of inner leads each of which is connected to the corresponding one of electrodes of the semiconductor chips, and the other inner lead group having a plurality of inner leads disconnected from the electrodes of the semiconductor chips and cut off from at least one of the outer leads.

8 Claims, 7 Drawing Sheets

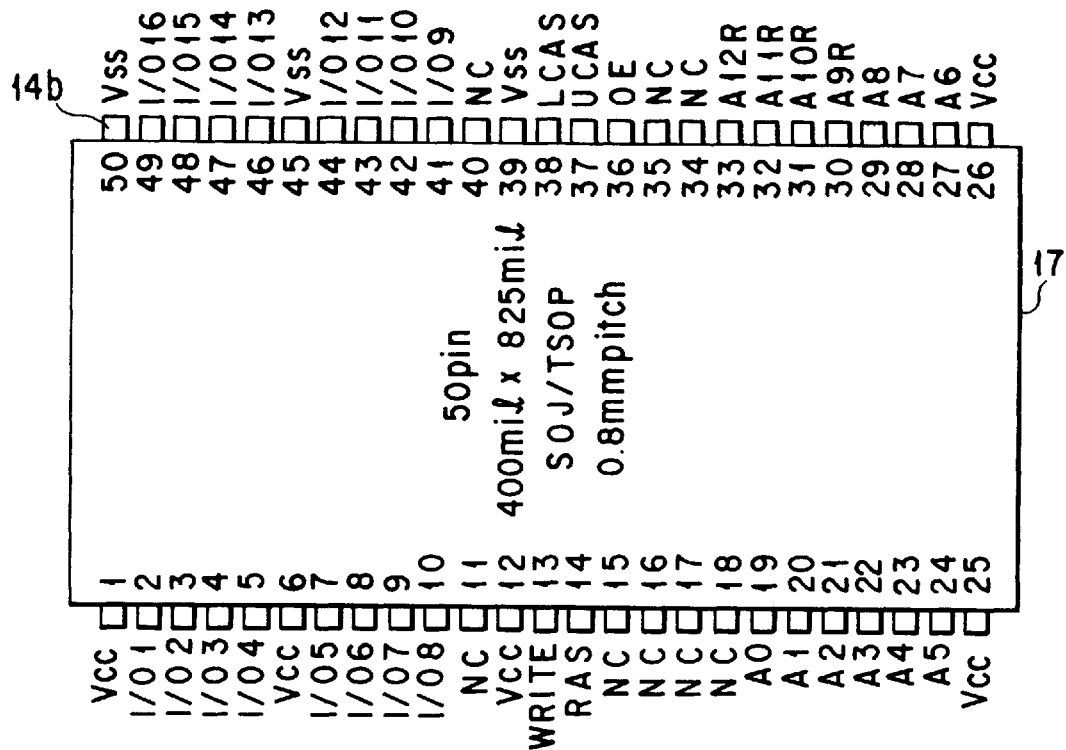
F I G. 11
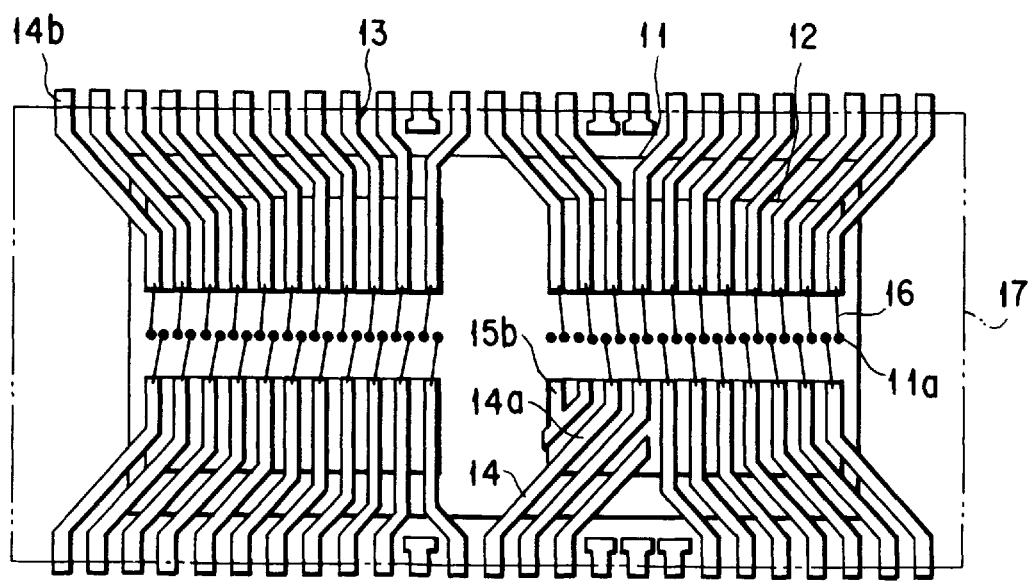
F I G. 12

LEAD FRAME USED FOR SEMICONDUCTOR CHIPS OF DIFFERENT BIT CONFIGURATIONS

BACKGROUND OF THE INVENTION

This invention relates to a lead frame applicable to various multibit configurations, to a semiconductor device having the lead frame, and to a method of manufacturing a semiconductor device, in which the lead frame is used and prevents adhesive tape from peeling from a semiconductor chip and the characteristics of the device from being deteriorated.

A semiconductor memory device has been required to have a high performance. For example of the 16 MB DRAM, various multibit configurations (e.g. ×1, ×4, ×8, ×9, ×16, ×18, ×32, ×36) are realized in the device now put into the market.

However, the manufacturing of various types of memory chips each having different multibit configurations results in a remarkable increase of the manufacturing cost.

Further, the chip size increases in accordance with the increase of the integration density of a semiconductor memory device. Several manufacturers have thus begun to employ the LOC (Lead On Chip) structure to reduce the device size.

In addition to the above, a semiconductor memory device is required to incorporate all the functions of the device into one chip such that various multibit configurations can be easily realized merely by changing the connections of the bonding wires.

A memory chip is thus formed to contain all the multibit configurations (i.e., formed in a one-chip) such that the multibit configuration of the device can be changed by changing the connections of the leads. By forming the device in such a manner, the increase of the manufacturing cost of the device is suppressed, and the manufacturing steps such as an assembling step can be made in common to the devices having different bit configurations.

However, the semiconductor memory devices having the different multibit configurations are naturally different from each other in number of pins (the number of the outer leads), even though the devices have the same size.

The positions and the number of electrode pads of the memory chip thus change in accordance with the employed multibit configuration. Therefore, when the memory chip having the pins of the numbers different from that of the electrode pads of the device is contained in the package, various problems will occur even if the device is a "one-chip" memory chip.

In a one-chip memory, the electrode pads are used commonly by multibit configurations contained in the memory chip even though the multibit configurations are different from each other. Accordingly, the intervals between the inner leads of the small multibit configuration (i.e., the configuration having a small number of I/O lines and address lines) increase in comparing with the large multibit configuration (i.e., the configuration having a large number of the I/O lines and address lines).

FIG. 1 shows ×8 bit configuration (400 mil, 32-pin) formed in a 64 MB DRAM in which ×16 bit configuration (4M ×16 bit) can be incorporated into a one-chip memory.

In such a device, the number of leads 4 of a lead frame 3 adhered to a surface of a semiconductor chip 1 with adhesive tape 2 is small, and thus large spaces 5 are formed between the leads 4.

If the spaces 5 are formed between the leads, the pressure applied on the adhesive tape 2 decreases, in the spaces 5, with the result that the adhesive tape peels off from the semiconductor chip 1 at the spaces during the die attaching step, as shown in FIG. 2.

The peeling off of the adhesive tape 2 makes the leads 4 unstable on the surface of the semiconductor chip 1, and may deteriorate the reliability of the device.

The peeling-off of the adhesive tape 2 may be prevented by dividing the adhesive tape 2. However, the adhesive tape 2 cannot be effectively divided due to the limitation of the forming technique of a metal mold used for the dividing. In addition, if the sizes of the divided tape portions vary in accordance with the multibit configuration contained in the device, the manufacturing step such as an assembling step cannot be made common to the different multibit configurations.

FIG. 3 shows the conventional device in which the peeling off of the adhesive tape is prevented in the above-mentioned ×8 bit configuration.

In this case, the peeling-off of the adhesive tape is prevented by inserting comb-like dummy leads 6 into the large spaces between the leads 4.

With this method, there will be no problem if the dummy leads 6 are arranged to the positions of the pins disconnected from a pad 1a. However, if the comb-like dummy leads 6 are formed by branching the leads 4 which are connected to the pads 1a, the capacitance of the leads 4 from which the dummy leads 6 are branched will increase, and the electrical characteristics of the device will be deteriorated.

This arrangement for preventing the peeling-off of the tape should not be used particularly, when I/O pins such as an address pins are used, if the shape of the comb-like leads is notably different from that of the other leads.

As described above, with conventionally used means in which dummy leads are formed in large open spaces between the leads in order to prevent the adhesive tape from peeling off from the semiconductor chip, the electrical characteristics of the device may be deteriorated.

BRIEF SUMMARY OF THE INVENTION

The object of the present of the present invention is to provide a lead frame applicable to various multibit configurations, to a semiconductor device having the lead frame, and to a method of manufacturing a semiconductor device, in which the lead frame is used and prevents adhesive tape from peeling from a semiconductor chip and the characteristics of the device from being deteriorated.

In order to attain the above-mentioned object, a lead frame of the present invention comprises a plurality of inner leads adhered onto a semiconductor chip with adhesive tape provided on the semiconductor chip; and a plurality of outer leads each formed integrally with the corresponding one of the inner leads, the plurality of inner leads comprising an inner lead group including a plurality of inner leads each of which is connected to the corresponding one of the electrodes of the semiconductor chips, and the other inner lead group having a plurality of inner leads disconnected from the electrodes of the semiconductor chips and cut off from at least one of the outer leads.

A method of manufacturing the semiconductor device using the lead frame according to the present invention comprises the steps of: preparing a lead frame having a plurality of inner leads comprising an inner lead group including a plurality of leads each of which is connected to the corresponding one of the electrodes of the semiconductor chip, and the other inner lead group including inner leads disconnected from the electrodes of the semiconductor chips, and outer leads each formed integrally with the corresponding one of the inner leads; cutting off from at least one of the outer leads the inner leads which belong to the inner lead group including inner leads disconnected from the electrodes of the semiconductor chips; mounting the lead frame on the semiconductor chip by adhering them by means of adhesive tape provided onto the semiconductor chip; and electrically connecting each of the distal end portions of the inner leads other than the inner leads cut off from the outer leads to the corresponding one of the electrodes of the semiconductor chip.

A semiconductor device according to the present invention comprises: a semiconductor chip; a plurality of electrodes provided on the semiconductor chip; a lead frame adhered to the semiconductor chip by adhesive tape and comprising a plurality of inner leads and a plurality of outer leads each formed integral with corresponding one inner lead, some of the inner leads connected to the electrodes of the semiconductor chip, and the other of the inner leads of the second group disconnected from the electrodes of the semiconductor chip and cut off from at least one of the outer leads; and a resin package sealing the semiconductor chip and a part of the lead frame.

According to the above-mentioned lead frame, semiconductor device having a lead frame and method of manufacturing the semiconductor device by using the lead frame, the adhesive tape can be prevented from peeling off from the semiconductor chip by pressing the adhesive tape on the semiconductor chip with use of the inner leads which are independent from the inner leads connected to the electrodes and are disconnected from the electrodes of the semiconductor chip. By forming the lead frame in this manner, the leads can be reformed in the original form in a bonding step of the chip, even if the shape of the leads remarkably differs in the forming of the lead frame.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 11 is an outer view of a one-chip package of the semiconductor device obtained by the method of manufacturing the semiconductor device using the lead frame according to the present invention, showing a layout of the pins of a 64 MB DRAM (×8);

FIG. 12 is a plane view of the semiconductor device contained in the package of FIG. 11.

DETAILED DESCRIPTION OF THE INVENTION

This invention can be more fully understood from the following detailed description when taken in conjunction with the accompanying drawings.

Figure 4:
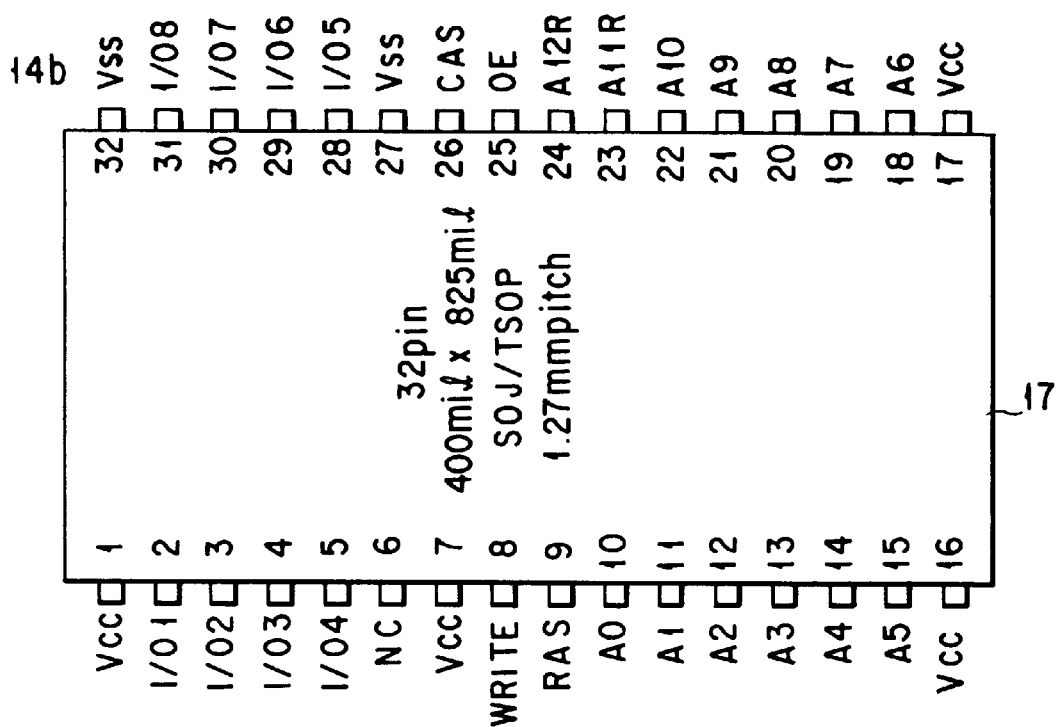
FIG. 4 is an outer view of a one-chip package of the semiconductor device obtained by the method of manufacturing the semiconductor device using the lead frame according to the present invention, showing a layout of the pins of a 64 MB DRAM (×8)

FIG. 4 is an outer view of a package of the semiconductor device (×8) obtained by the method of manufacturing the semiconductor device using the lead frame according to the present invention, showing a layout of the pins of a 64 MB DRAM (400 mil, 32-pin) in which ×16 bit configuration can be incorporated as a one-chip memory.

Figure 5:
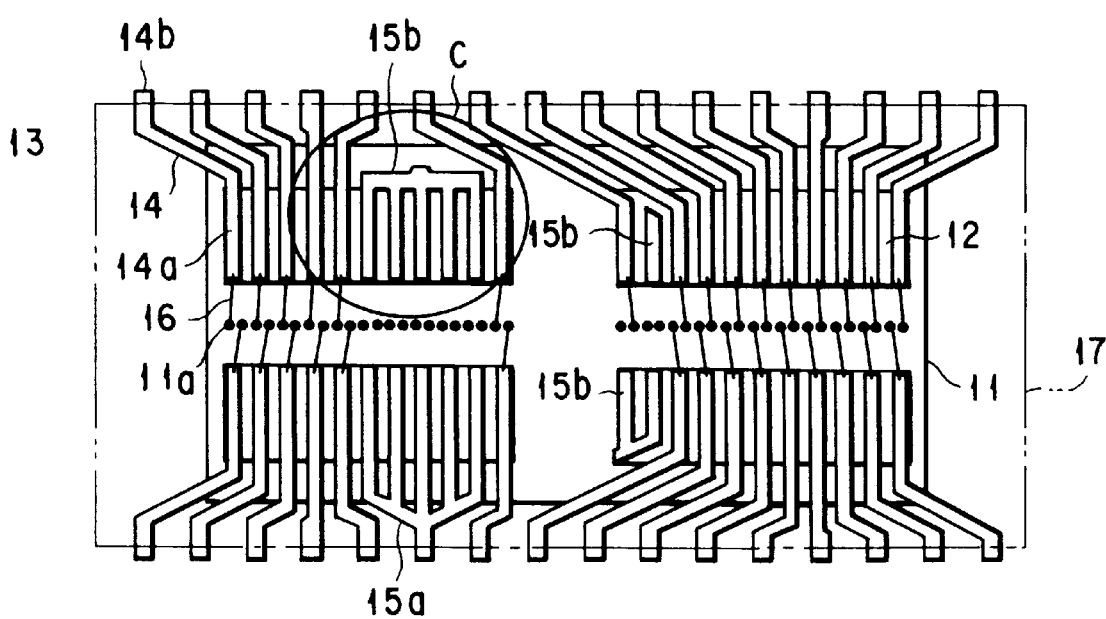
FIG. 5 is a plane view of the semiconductor device contained in the package of FIG. 4.

FIG. 5 is a plane view of the semiconductor device contained in the package of FIG. 4.

As should be clear from these drawings, leads 14 of a lead frame 13 and dummy leads 15a and 15b in the semiconductor memory device are adhered onto the surface of the semiconductor chip 11 shown in FIG. 5 with use of adhesive tape 12, thereby a LOC structure is realized.

An inner lead 14a of each of the leads 14 is connected to the corresponding one of center pads (electrodes) 11a with use of one of bonding wires 16 in accordance with the multibit configuration of the device.

The semiconductor chip 11 is covered with a package 17 which is formed from molding resin or the like.

Each of outer leads 14b of the leads 14, which protrudes from the package 17, is formed in a J-shape, for example, and is provided with a pin.

The dummy leads 15a and 15b are provided to the device to prevent the adhesive tape 12 from peeling off from the chip surface in spaces formed between the leads 14 during the "die-attaching" step.

The dummy lead 15a is formed by branching the inner lead corresponding to the sixth pin in a plurality of outer leads.

The dummy leads 15b are formed in a comb-like shape by branching some of the inner leads 14 corresponding to the eighth and twenty-seventh pins in the plurality of outer leads. The inner leads 14a are cut off before the die-attaching step from the corresponding outer lead in the portions on which the adhesive tape 12 is absent. In this manner, the dummy leads 15b are left on the adhesive tape 12.

Figure 8:
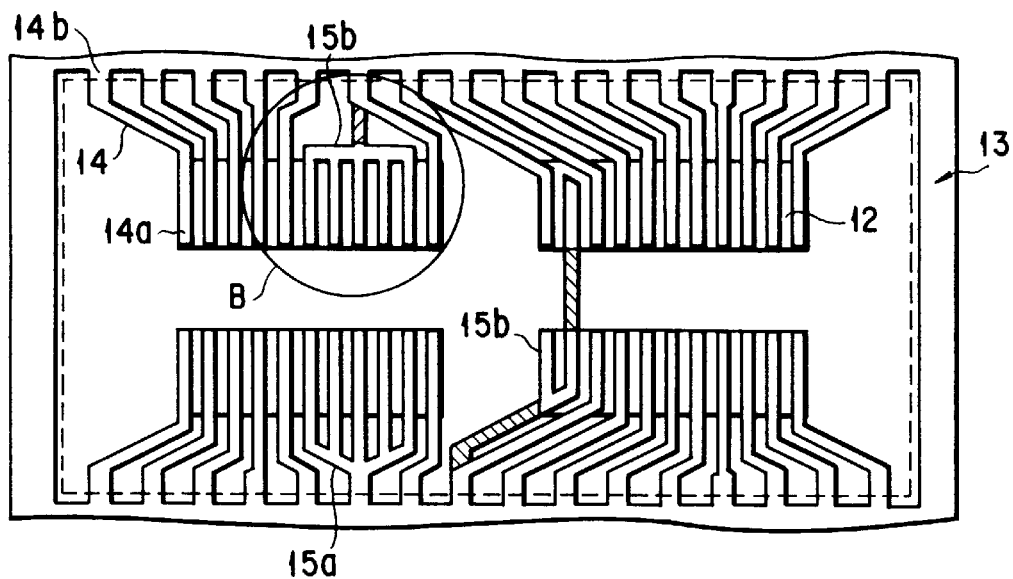
FIG. 8 is a plane view of the semiconductor device of the present invention, for illustrating the forming steps of the lead frame shown in FIG. 6.

Further, according to the present invention, the margin for the frame can be expanded by further extending the inner lead portions branched from a part of the inner leads 14 which corresponds to the eighth pin in the outer leads so as to leave the dummy leads 15b on the opposite adhesive tape 12, as shown in FIG. 8.

FIGS. 6–10 are views for illustrating the steps of manufacturing the semiconductor memory device shown in FIG. 5 using the lead frame of the present invention.

Figure 6:
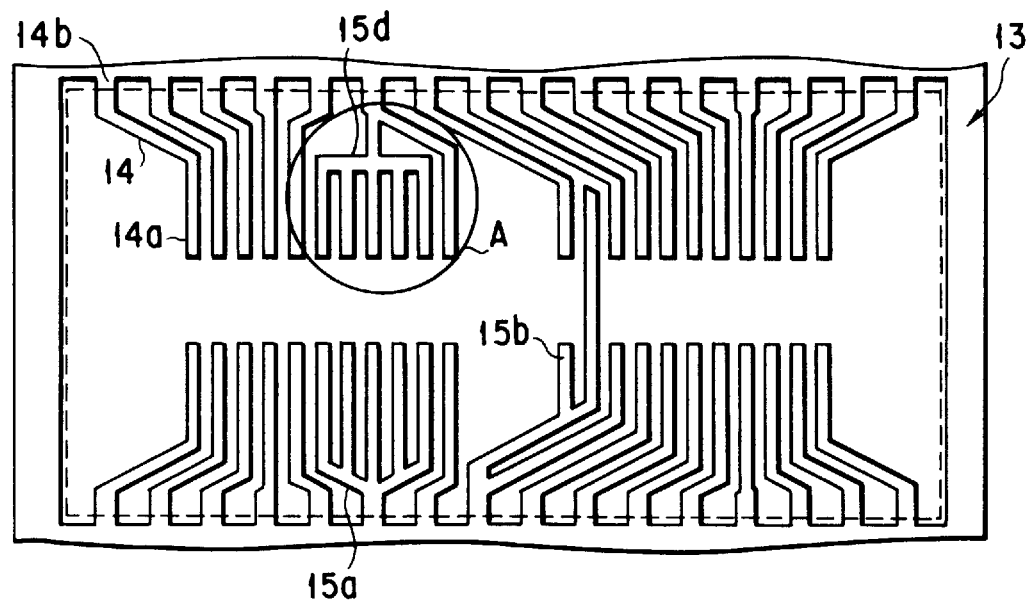
FIG. 6 is a plane view of the semiconductor device of the present invention, showing the original shape of the lead frame.
Figure 7:
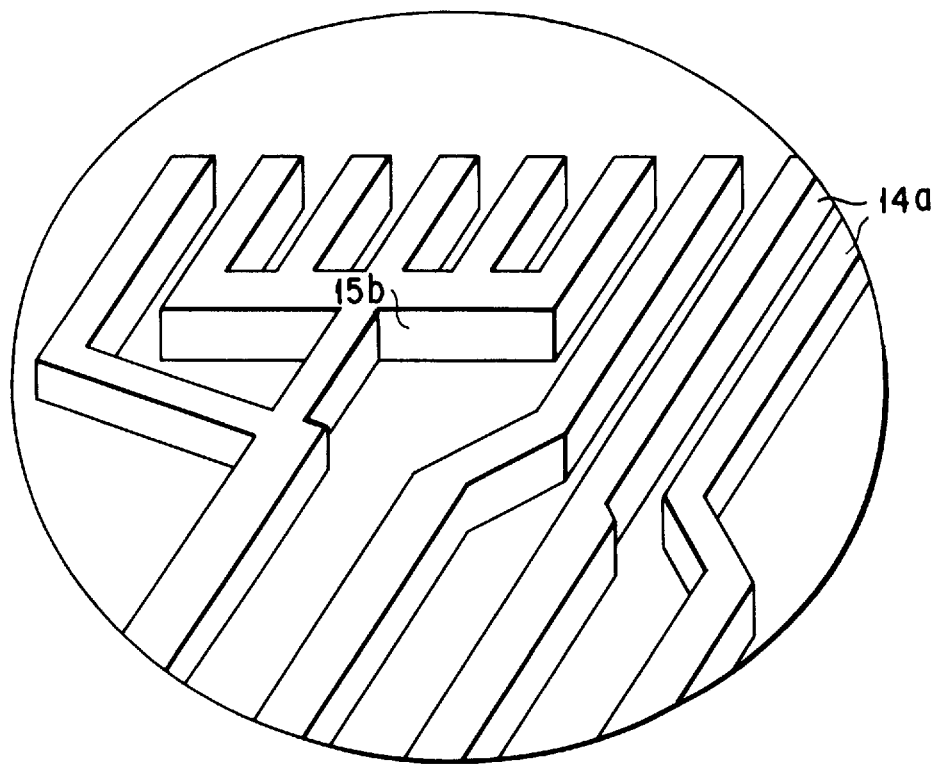
FIG. 7 is an enlarged perspective view of a portion A shown in FIG. 6.

As shown in FIG. 6, a lead frame 13 is formed at first of the process such that dummy leads 15a and 15b are formed in the portion in which leads are not provided due to the difference of the bit configuration, by branching the inner leads 14a corresponding to the sixth, eighth, and twenty seventh pins among inner leads 14 each connected to corresponding one of pins 1–32. FIG. 7 is an enlarged perspective view of a portion A shown in FIG. 6.

Figure 9:
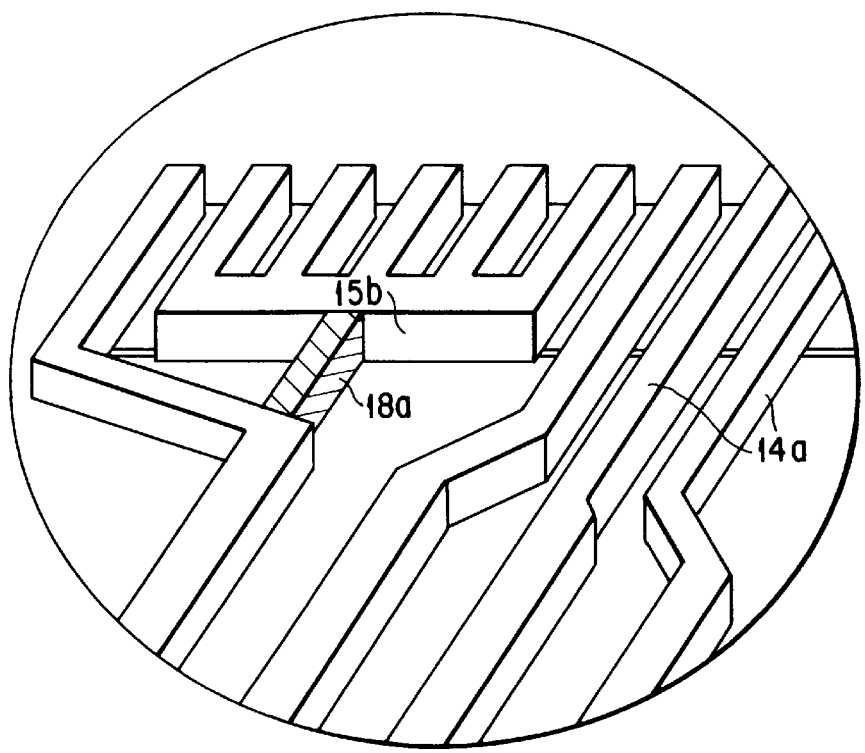
FIG. 9 is an enlarged perspective view of a portion B shown in FIG. 8.

Subsequently, the adhesive tape 12 is adhered to the lead frame 13, as shown in FIG. 8. The shaded portion 18a in the portion B shown in FIG. 8 is removed from the comb-shaped portion of the branched inner leads 14a. FIG. 9 is an enlarged perspective view of the comb-shaped portion of the inner leads 14a including the shaded portion 18a shown in FIG. 8.

Next, a part (the shaded portion in the drawing) of the inner leads 14a corresponding to the eighth, and twenty seventh pins is cut by use of a mold or laser to disconnect the dummy leads 15b from the inner leads 14a of the leads 14 not connected to the pads 11a on the semiconductor chip 11.

Figure 1:
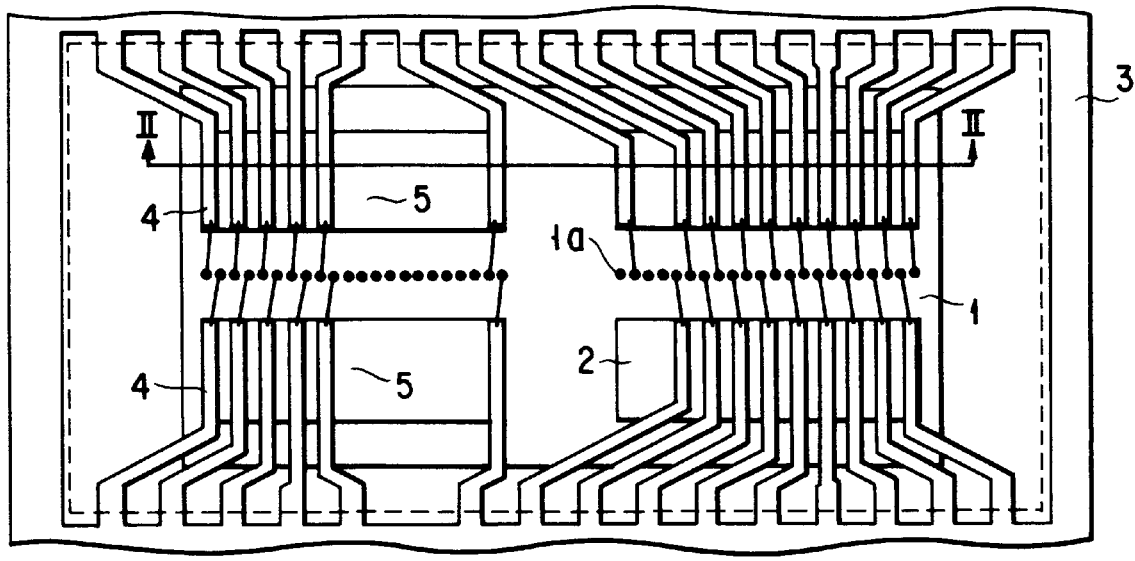
FIG. 1 is a plane view of a schematic structure of the conventional semiconductor device.
Figure 2:
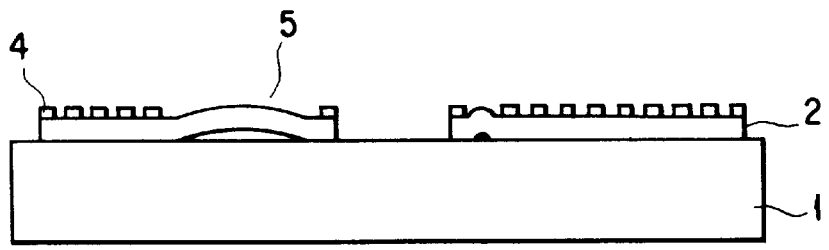
FIG. 2 is a cross-sectional view of the conventional semiconductor taken along a line II—II of FIG. 1.
Figure 3:
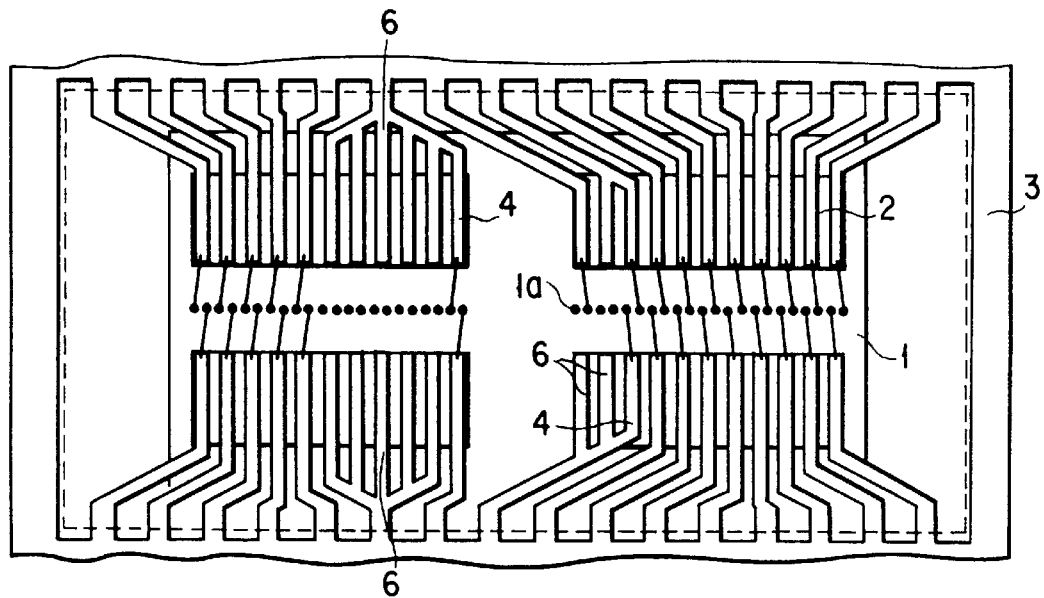
FIG. 3 is a plane view of the other schematic structure of the conventional semiconductor device.
Figure 10:
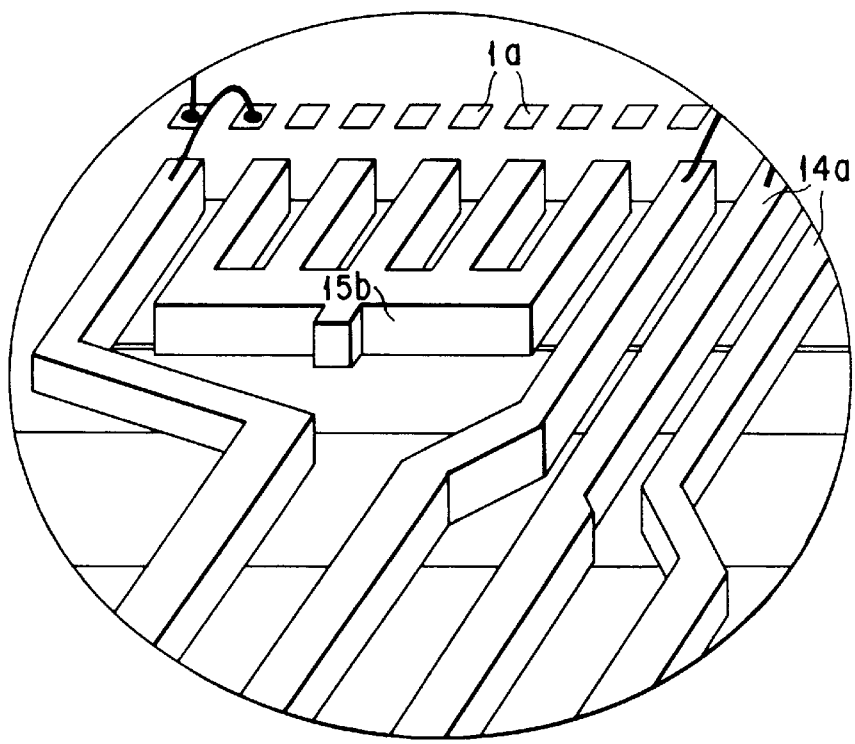
FIG. 10 is an enlarged perspective view of a portion C shown in FIG. 5.

FIG. 10 shows an enlarged perspective view of the comb-shaped portion of the inner leads 14a disconnected from the outer lead 14b, and corresponds to a portion C shown in FIG. 5.

By forming the dummy leads 15b as described above, the capacitance of the leads 14 corresponding to the eighth and twenty-seventh pins can be set at substantially the same level as that of the other leads 14. In this manner, the dummy leads 15a and 15b are left in the portion in which the adhesive tape 12 is provided but leads are not originally provided due to the difference of the multibit configuration, thereby the adhesive tape can be prevented from peeling off from the semiconductor chip without deteriorating the electrical characteristics of the device.

Further, the present invention is applicable to a variety of usages in comparison with the method of preventing the tape peeling-off by dividing the adhesive tape 12, since the dummy leads 15b can be easily cut by use of the mold or laser, as will be described below.

In the present invention, the lead frame 13 mentioned above is adhered to the surface of the semiconductor chip 11 by means of the adhesive tape 12, then, each of the leads 14 is connected to the corresponding one of electrode pads 11a on the semiconductor chip 11 in accordance with the bit configuration by use of the bonding wires 16.

After sealing the peripheral portion of the semiconductor chip 11 in a package 17 thereafter, each of the outer leads 14b are cut from the frame of the lead frame 13 to form the lead frame in a desired shape. In this manner, the semiconductor memory device having the structure shown in FIG. 5 can be obtained.

As described above, the present invention prevents the peeling-off of the adhesive tape 12 by use of the dummy leads 15b cut off from the leads not connected to the pads 11a of the semiconductor chip 11.

In the present invention, the dummy leads 15b formed by branching the leads in a comb-like shape are provided to large spaces between the leads and cut from the leads before the die-attaching. By forming the dummy leads 15b in this manner, the shape of the leads 14 can be reformed when the bonding step is performed even if the shape of the lead frame 13 totally differs from the original shape. The level of the capacitances of the leads therefore can be set at substantially the same level. As should be clear from this, according to the present invention, the peeling-off of the adhesive tape 12 can be prevented by leaving the cut dummy leads 15b in the portion in which leads 14 are not provided due to the difference of the multibit configuration, by branching the inner leads without deteriorating the electrical characteristics.

In the above embodiment, a 64 MB DRAM (400 mil, 32-pin) in which the ×8 Bit configuration is incorporated as a one-chip memory is employed, for example. The present invention is, however, not limited to the above embodiment, but can be applied to the multibit configuration other than the ×8 bit configuration.

FIGS. 11 and 12 show the example of the 64 MB DRAM (400 mil, 50-pin) in which ×16 bit configuration can be incorporated as a one-chip memory.

As shown in FIG. 12, this ×16 bit configuration is formed to prevent the peeling-off of adhesive tape 12 from a semiconductor chip 11 without deteriorating the electrical characteristics of the device. This is because, a dummy lead 15b branched from a lead 14 corresponding to the thirteenth outer lead 14b and an inner lead 14a connected to a pad 11a of a semiconductor chip 11 are independently arranged.

In this manner, the reliability can be attained with no deterioration of the electrical characteristics of the device or no change in the shape of the adhesive tape 12, even if the number of pins is different from that of the multibit configurations contained in the packages.

The lead frame and a method of manufacturing a semiconductor device using the lead frame according to the present invention can be also applied to the semiconductor memory device other than the 64 MB DRAM and the semiconductor device having the LOC structure.

In addition, it is understood that the shape of the lead frame of the present invention is not limited to those described in the above embodiment.

Figure 13:
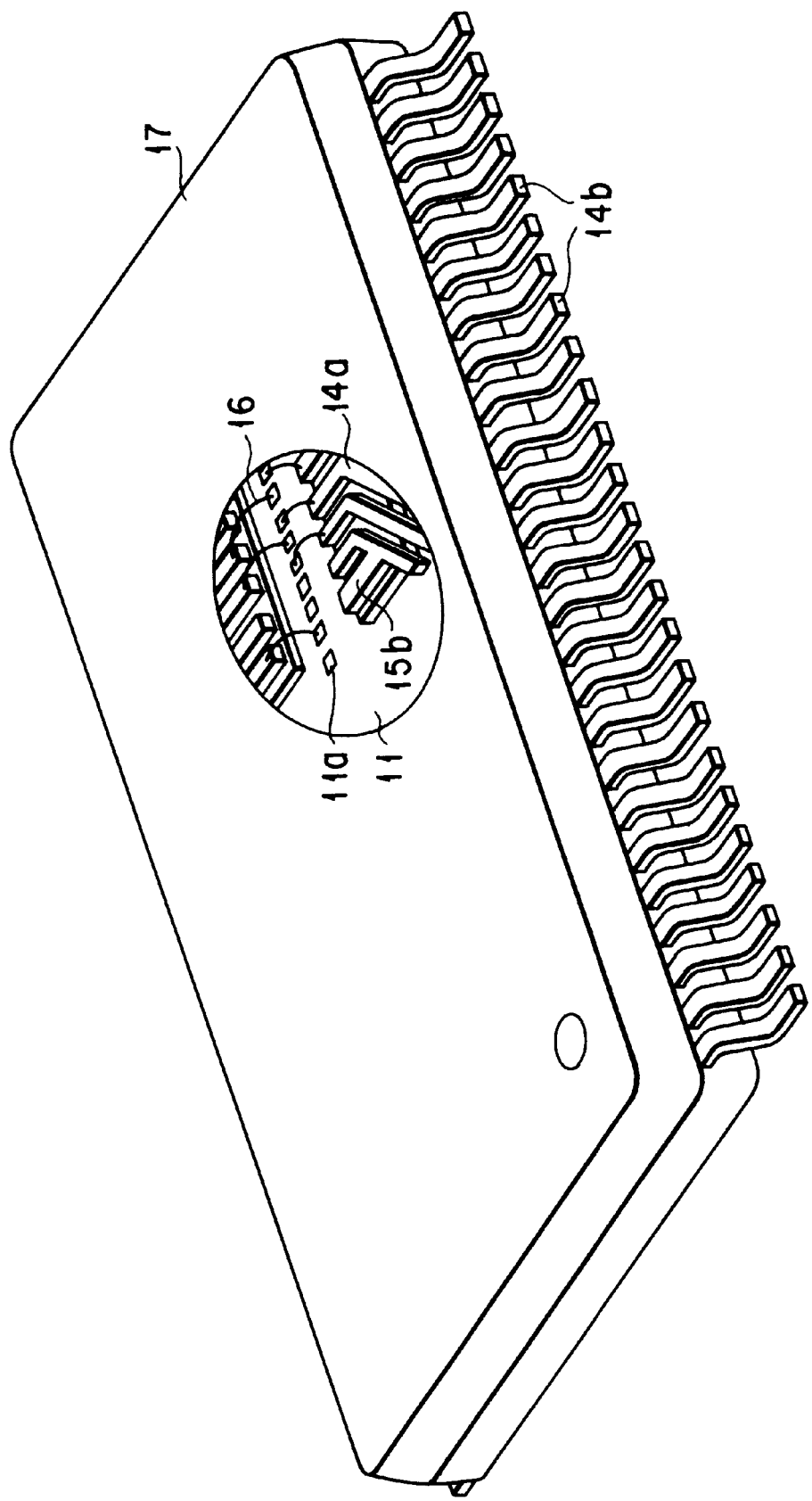
FIG. 13 is a cutaway perspective view of a semiconductor device manufactured by using the lead frame according to the present invention.

A semiconductor device manufactured by using the lead frame according to the invention will be described, with reference to FIG. 13. FIG. 13 is a cutaway perspective view, showing a part of the interior of the device.

As shown in FIG. 13, a dummy lead 15b is branched from a lead corresponding an outer lead 14b, and an inner lead 14a is connected to the pad 11a of the semiconductor chip 11.

After the peripheral portion of the semiconductor chip 11 is sealed in a resin package 17, the outer leads 14b are cut from the frame, changing the lead frame to one having a desired shape. As a result, a semiconductor memory device of the structure shown in FIG. 13 is manufactured.

The semiconductor device operates reliably. Its electrical characteristics are not deteriorated because the adhesive tape does not change in shape even if the number of outer pins differs from the number of pins of the multibit structure sealed in the resin package 17.

It is also understood that various changes and modifications may be effected therein by one skilled in the art without departing from the scope or spirit of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

What is claimed is:

1. A lead frame comprising:

a plurality of inner leads provided in an inner lead area and adhered onto a semiconductor chip having a plurality of electrodes by adhesive tape provided on the semiconductor chip; and a plurality of outer leads each formed integrally with corresponding one of the inner leads, the plurality of inner leads comprising a first inner lead group including a plurality of inner leads each of which is connected to a corresponding electrode of the semiconductor chip in a bonding area, and a second inner lead group having a plurality of inner leads disconnected from the electrodes of the semiconductor chip, but connected to one another by a mutual connection portion thereof in a dead space formed in the inner lead area outside the bonding area.

2. A lead frame according to claim 1, wherein each of the inner leads has an end closest to the outer leads provided on a portion of the semiconductor chip in which the adhesive tape is not present.

3. A lead frame according to claim 1, wherein the adhesive tape is divided into a plurality of parts to be adhered to the semiconductor chip, the plurality of inner leads are put on corresponding adhesive tape parts, one of the inner leads located on one of a pair of the adhesive tape parts facing each other extends and occupies a space between adjacent leads located on the other one of the pair of the adhesive tape parts, the extending portion of the inner leads is left on the other one of the pair of the adhesive tape parts as a part of the inner leads on the other one of the pair of the adhesive tape part.

4. A lead frame according to claim 1, wherein the semiconductor chip has the plurality of electrodes on a surface, the inner leads are located on at least one pair of adhesive tape parts which face each other to locate the electrodes therebetween, and the inner leads disconnected from the electrodes are branched in a comb-like shape by the mutual connection portion.

5. A semiconductor device comprising:

a semiconductor chip;

a plurality of electrodes provided on the semiconductor chip;

a lead frame adhered to the semiconductor chip by adhesive tape and comprising a plurality of inner leads provided in an inner lead area and a plurality of outer leads each formed integral with corresponding one inner lead, some of the inner leads being connected to the electrodes of the semiconductor chip in a bonding area, and the other of the inner leads of the second group being disconnected from the electrodes of the semiconductor chip, but connected to one another by a mutual connection portion thereof in a dead space formed in the inner lead area outside the bonding area; and a resin package sealing the semiconductor chip and a part of the lead frame.

6. A semiconductor device according to claim 5, wherein each of the inner leads has an end closest to the outer leads provided on a portion of the semiconductor chip in which the adhesive tape is not present.

7. A semiconductor device according to claim 5, wherein the adhesive tape has a plurality of parts adhered to the semiconductor chip, said inner leads form groups mounted on the parts of the adhesive tape, respectively and one of said inner leads provided on one of two parts of the adhesive tape which face each other has a portion which extends and occupies a space between adjacent leads provided on the other of the two parts of the adhesive tape, which is cut from the other portion and which remains on the other of the two parts of the adhesive tape.

8. A semiconductor device according to claim 5, wherein the adhesive tape has a plurality of parts adhered to the semiconductor chip, the inner leads are mounted on at least two parts of the adhesive tape which face each other, the electrodes are located between the two parts of the adhesive tape, and the inner leads disconnected from the electrodes are branched in a comb-like shape by the mutual connection portion.

* * * * *